United States Patent [19]
Childs et al.

[11] Patent Number: 5,670,815
[45] Date of Patent: Sep. 23, 1997

[54] LAYOUT FOR NOISE REDUCTION ON A REFERENCE VOLTAGE

[75] Inventors: Lawrence F. Childs; Stephen T. Flannagan; Ray Chang; Donovan L. Raatz, all of Austin, Tex.

[73] Assignee: Motorola, Inc., Schaumburg, Ill.

[21] Appl. No.: 270,560

[22] Filed: Jul. 5, 1994

[51] Int. Cl.⁶ .................... H01L 29/76; H01L 31/062
[52] U.S. Cl. .................. 257/386; 257/665; 257/776
[58] Field of Search ..................... 257/307, 665, 257/691, 776, 386

[56] References Cited

U.S. PATENT DOCUMENTS

| | | | |
|---|---|---|---|
| 4,905,068 | 2/1990 | Satoh et al. | 257/776 |
| 4,937,649 | 6/1990 | Shiba et al. | 257/665 |
| 4,941,031 | 7/1990 | Kumagai et al. | 257/776 |
| 5,006,918 | 4/1991 | Deutsch et al. | 257/665 |
| 5,014,110 | 5/1991 | Satoh | 257/776 |
| 5,027,174 | 6/1991 | Mimoto | 257/665 |
| 5,208,725 | 5/1993 | Akcasu | 257/307 |
| 5,446,311 | 8/1995 | Ewen et al. | 257/776 |
| 5,471,093 | 11/1995 | Cheung | 257/776 |

FOREIGN PATENT DOCUMENTS

| | | | |
|---|---|---|---|
| 0218948 | 8/1992 | Japan | 257/665 |
| 0262567 | 9/1992 | Japan | 257/665 |

OTHER PUBLICATIONS

"Motorola Communications Device Data", DL136/D, Rev 3, 1993, pp. 2–698 and 4–4. no month.

*Primary Examiner*—Tom Thomas
*Assistant Examiner*—David Ostrowski
*Attorney, Agent, or Firm*—Daniel D. Hill

[57] ABSTRACT

A layout portion (20) has a first portion (25), and a second portion (55). In the first portion (25), a reference voltage line (27) is disposed between two $V_{DD}$ power supply lines (26, 30) for a first predetermined length, for providing capacitive coupling between $V_{DD}$ and a reference voltage. In the second portion (55), the reference voltage line (27) is disposed between two $V_{SS}$ power supply lines (28, 41) for a second predetermined length, for providing capacitive coupling between $V_{SS}$ and the reference voltage. The capacitive coupling stabilizes the reference voltage with respect to the power supply voltage, and reduces power supply noise due to lead inductance and changing current demand. In addition, the power supply lines (26, 28, 30, 41) are disposed half above an N-type region (22) and half above a P-type substrate (21) for reducing local transistor switching noise.

11 Claims, 2 Drawing Sheets

LAYOUT FOR NOISE REDUCTION ON A REFERENCE VOLTAGE

FIELD OF THE INVENTION

This invention relates generally to noise reduction, and more particularly, to reducing noise on a reference signal.

BACKGROUND OF THE INVENTION

Reference voltage circuits, of one form or another, exist in many integrated circuits, and are common in large integrated circuit applications such as integrated circuit memories. A reference voltage circuit provides a voltage that is used as a reference for other signals in the integrated circuit. For example, the reference voltage may be one input to a differential amplifier, and an input signal, such as an address signal in an integrated circuit memory, may be another input to the differential amplifier. The reference voltage is generally provided at about the midpoint of a logic swing of the input signal. In the differential amplifier, the input signal is compared to the reference voltage. If the input signal has a higher voltage than the reference voltage, a logic state of the input signal is a logic high, or logic "one". Conversely, if the input signal has a lower voltage than the reference voltage, a logic state of the input signal is a logic low, or logic "zero".

In order to supply a stable reference voltage, a reference voltage generating circuit typically generates the reference voltage based on a bandgap voltage, and references the reference voltage to one of the power supply voltages, such as ground. A stable reference voltage is especially important in low voltage applications, or in circuits using signals having a relatively small signal swing, such as an integrated circuit memory that receives ECL (emitter-coupled logic) input signals.

A power supply voltage is usually distributed across an integrated circuit by relatively thin metal power supply lines, or conductors. Normally, a voltage drop along a power supply conductor is reduced by making the metal lines of the power supply conductors as wide as possible. But there is a tradeoff between the width of the metal lines and integrated circuit size. Size constraints do not normally allow the metal lines to be wide enough to reduce the series resistance and capacitance enough to provide a power supply voltage adequate to guarantee proper operation of the integrated circuit at very high speeds.

The power supply lines can also be a source of noise on an integrated circuit memory. The noise immunity of an integrated circuit is commonly specified in terms of noise margins. Noise margins are usually given for worst case conditions, which includes the most unfavorable connections of the input terminals and the poorest combination of circuit and device parameters, along with a maximum fan-out. As the operating speed of an integrated circuit memory increases, the negative effects of noise, or a voltage drop, in the power supply increase. The more noise or voltage drop there is on the power supply lines, the smaller the range of variability allowed in the reference voltages because the memory must operate within narrower margins. In addition to power supply noise, power supply lead inductance and circuit switching noise can also affect the voltage level of the reference voltage. Also, the amount of current flow may vary greatly in the integrated circuit, causing voltage fluctuations in the power supply lines. Because the input signal is usually provided by a source external to the integrated circuit, the reference voltage generator is typically located near the power supply voltage pads, so that the reference voltage generator receives a power supply voltage that is substantially the same as the source of the input signal, and is less affected by voltage drops due to changing current demand.

The introduction of the so called revolutionary pinout technique has alleviated some of the problems with power distribution on integrated circuit memories by decreasing the power supply conductor lengths and increasing the number of power supply bonding pads and power supply pins. But increasing the size and density of the integrated circuit memory have correspondingly caused an increase in the length of the power supply conductors and in the reference voltage lines. Nevertheless, as higher speeds are demanded of integrated circuit memories, any power supply variations that interfere with system operation become intolerable. The reference voltage generation circuits must remain stable and must supply constant voltage levels in order to insure accurate system operation.

SUMMARY OF THE INVENTION

Accordingly, there is provided, in one form, a layout for reducing power supply noise on a reference voltage. A first conductive layer overlies a semiconductive substrate. A second conductive layer overlies the semiconductive substrate and is laterally adjacent to the first conductive layer. A first power supply line overlies the first conductive layer and is coupled to the first conductive layer. A second power supply line overlies the second conductive layer and is coupled to the second conductive layer. A reference voltage line overlies the first conductive layer and is laterally adjacent to the first power supply line for a first predetermined length. The reference voltage line is then disposed above the second conductive layer and disposed laterally adjacent to the second power supply line for a second predetermined length.

In another embodiment, a method is provided for reducing power supply noise on the reference voltage. These and other features and advantages will be more clearly understood from the following detailed description taken in conjunction with the accompanying drawings.

DESCRIPTION OF A PREFERRED EMBODIMENT

Generally, the present invention provides a layout for capacitively coupling a reference voltage line to both power supply lines. The capacitive coupling stabilizes the reference voltage with respect to the power supply voltage, thus reducing power supply noise due to lead inductance and changing current demand. The layout positions the reference voltage line between two first power supply lines ($V_{DD}$), for a first predetermined length, and then positions the reference voltage line between two second power supply lines ($V_{SS}$) for a second predetermined length. The amount of capacitive coupling depends on such factors as the length of the first and second predetermined lengths and the dimensions of the metal lines. In addition, the power supply lines and the reference voltage lines are positioned half above an N-type semiconductive region and half above a P-type semiconductive substrate. The N-type region is connected to a local $V_{DD}$, and the P-type region is connected to a local $V_{SS}$. A capacitive coupling occurs between both the power supply lines and reference voltage line to both the P-type and N-type regions. The capacitive coupling due to the underlying P-type region substantially cancels the capacitive coupling due to the underlying N-type region, reducing local power supply noise and transistor switching noise.

Figure 1:
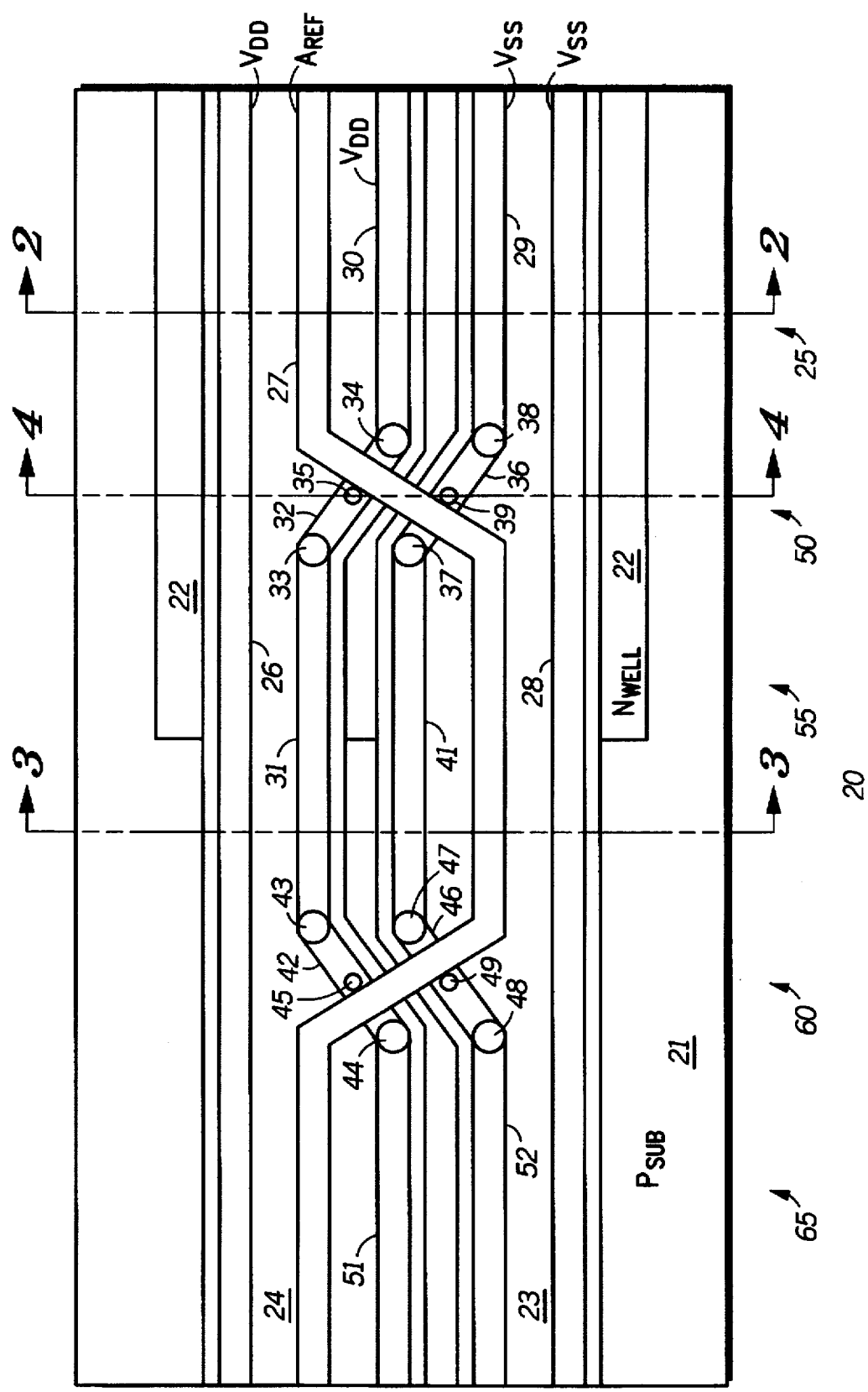
FIG. 1 illustrates in layout diagram form, a layout portion in accordance with the present invention.

The present invention can be more fully described with reference to FIG. 1–5. FIG. 1–5 incorporate many of the same or similar elements. Therefore, like reference numerals designate identical or substantially corresponding parts throughout the several views. FIG. 1 illustrates in layout diagram form, layout portion 20 in accordance with the present invention. Note that layout portion 20 is not drawn to scale. Layout portion 20 is a portion of an integrated circuit layout for reference voltage line 27 and the power supply lines used to shield reference voltage line 27. Layout portion 20 includes first portion 25, cross-over portion 50, second portion 55, cross-over portion 60, third portion 65, P-type semiconductive substrate 21, N-type semiconductive region 22, and conductive layers 23 and 24. Layout portion 20 also includes metal power supply lines 26, 28, 29, 30, 31, 41, 51, and 52, metal power supply lines 32, 36, 42, and 46 reference voltage line 27, vias 33, 34, 37, 38, 43, 44, 47, and 48 and contacts 35, 39, 45, and 49.

N-type semiconductive region 22 is a well region implanted in P-type semiconductive substrate 21 using an N-type conductive material such as arsenic or phosphorus. Conductive layers 23 and 24 are silicided polysilicon layers that have been chemically deposited over P-type semiconductive substrate 21 and N-type semiconductive region 22. In other embodiments, conductive layers 23 and 24 may be formed from other conductive materials such as tungsten, molybdenum, or aluminum.

Layout portion 20 is fabricated in two layers of metal. Reference voltage line 27 is in a second, or top, layer of metal, and the power supply lines are fabricated in both layers of metal. In the illustrated embodiment, the power supply lines are formed in the second layer of metal in first portion 25, second portion 55, and third portion 65. The power supply lines are disposed in the first layer of metal in cross-over areas 50 and 60. Cross-over areas 50 and 60 are provided for allowing reference voltage line 27 to cross above the power supply lines. Reference voltage line 27 crosses power supply lines 32 and 36 in cross-over area 50, and is disposed over conductive layer 23 between power supply lines 41 and 28 in second portion 55 for a second predetermined length. Reference voltage line 27 then re-crosses to conductive layer 24 in cross-over area 55. In addition to capacitively coupling the power supply lines to reference voltage line 27, the power supply lines also shield reference voltage line 27 from other signal lines (not shown) that run parallel to reference voltage line 27.

In first portion 25, power supply line 26 is formed in metal overlying conductive layer 24 and is for conducting a power supply voltage labeled "$V_{DD}$" from a power supply pad (not shown) to provide shielding for reference voltage line 27. Also, power supply line 28 is formed in metal overlying conductive layer 23 and is for conducting a power supply voltage labeled "$V_{SS}$" from a power supply pad (not shown) to provide shielding for reference voltage line 27. In a preferred embodiment, power supply voltage $V_{DD}$ is ground, and power supply voltage $V_{SS}$ is a negative voltage. In other embodiments, $V_{DD}$ may be a positive voltage and $V_{SS}$ may be connected to ground. In first portion 25, power supply line 30 is substantially parallel to, and spaced apart from power supply line 26. Power supply lines 26 and 30 are both coupled to the power supply pad for receiving $V_{DD}$. Likewise, power supply lines 28 and 29 are both coupled to a power supply pad for receiving $V_{SS}$. Reference voltage line 27 is for conducting a reference voltage labeled "$A_{REF}$" from $A_{REF}$ generating circuit 58 (FIG. 5) to circuits requiring a reference voltage. In a preferred embodiment, $A_{REF}$ generating circuit 58 is located near the power supply pads to reference the reference voltage $A_{REF}$ as close as practical to an external ground potential. Reference voltage line 27 is disposed above conductive layer 24 and between power supply lines 26 and 30 in first portion 25 for a first predetermined length.

Figure 4:
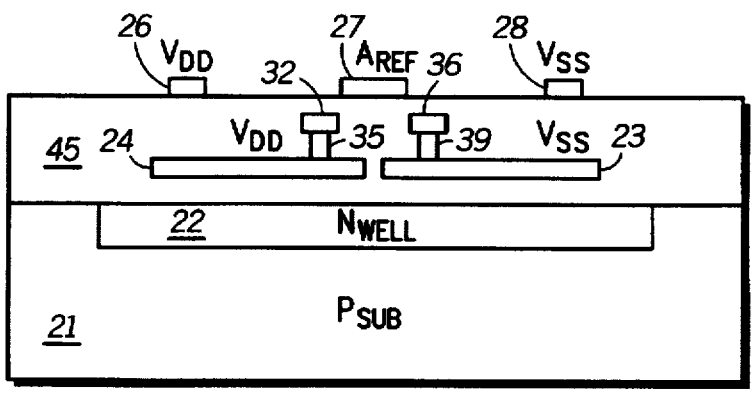
FIG. 4 illustrates a cross-sectional view along line 4—4 of the power supply lines and the reference voltage line of the layout of FIG. 1.

In cross-over area 50, via 34 connects power supply line 30 in the second metal layer to power supply line 32 in the first metal layer. Via 33 connects power supply line 32 in the first metal layer to power supply line 31 in the second metal layer. Via 38 connects power supply line 29 in the second metal layer to power supply line 36 in the first metal layer. Via 37 connects power supply line 36 in the first metal layer to power supply line 41 in the second metal layer. Note that any conventional method for coupling the power supply lines in the first metal layer to the power supply lines in the second metal layer may be used, (for example, a tungsten plug). Also, in other embodiments, reference voltage line 27 may cross under the power supply lines instead of over them as illustrated in FIG. 1 and FIG. 4. Also, in cross-over areas 50 and 60, contacts are used to connected power supply lines 32, 36, 42, and 46 in the first metal layer to conductive layers 23 and 24. FIG. 4 illustrates contacts 35 and 39 in a cross-sectional view.

Cross-over area 60 is substantially the same as cross-over area 50, except that reference voltage line 27 crosses from conductive layer 23 back to conductive layer 24 over power supply lines 42 and 46. Via 43 connects power supply line 31 to power supply line 42. Via 44 connects power supply line 42 to power supply line 51. Via 47 connects power supply line 41 to power supply line 46. Via 48 connects power supply line 46 to power supply line 52.

In a preferred embodiment, layout portion 20 is separate from a power supply distribution layout in an integrated circuit, such as an integrated circuit memory. In an integrated circuit memory, layout portion 20 is located between a memory array and peripheral circuits. N-type region 22 is coupled to a demand end, or local, $V_{DD}$ power supply and P-type region 21 is coupled to a local $V_{SS}$ power supply. In layout portion 20, the metal power supply lines, reference voltage line 27, and first and second conductive layers 23 and 24 run above N-type region 22 for approximately one-half of their length and surface area, and run above P-type semiconductive substrate for the other one-half of their length and surface area. N-type regions similar to N-type region 22 are alternated with P-type semiconductive regions similar to P-type substrate 21 to reduce local transistor switching noise generated by circuits located in N-type and P-type regions in the vicinity of layout portion 20. The size, location, or order of the N-type and P-type regions are not especially important for purposes of implementing the invention.

Figure 2:
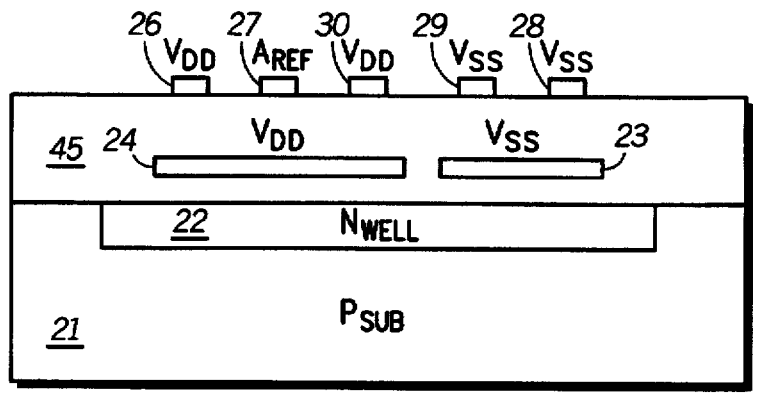
FIG. 2 illustrates a cross-sectional view along line 2—2 of the power supply lines and the reference voltage line of the layout of FIG. 1.

FIG. 2 illustrates a cross-sectional view along line 2—2 of FIG. 1, of power supply lines 26, 28, 29, and 30 and reference voltage line 27 of first portion 25. Reference voltage line 27 is disposed between power supply lines 26 and 30, and overlies conductive layer 24. Capacitive coupling occurs between power supply lines 26 and 30, conductive layer 24, and reference voltage line 27 in first portion 25. Also, conductive layers 23 and 24 are capacitively coupled to N-type region 22 to reduce local transistor switching noise.

Also illustrated in FIG. 2 is insulator 45. Insulator 45 is used to isolate the metal lines from each other and from conductive layers 23 and 24. Insulator 45 may be constructed of any insulating material, such as an oxide, and may be formed using multiple layers. Insulator 45 is not shown in FIG. 1 in order to expose the power supply lines and conductive layers 23 and 24.

Figure 3:
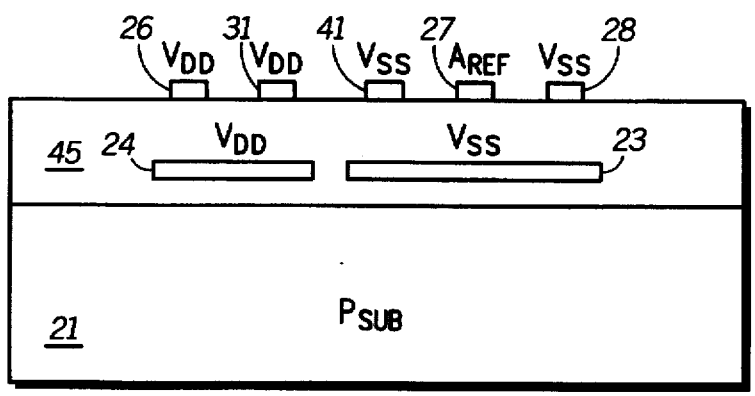
FIG. 3 illustrates a cross-sectional view along line 3—3 of the power supply lines and the reference voltage line of the layout of FIG. 1.

FIG. 3 illustrates a cross-sectional view along line 3—3 of FIG. 1, of power supply lines 26, 28, 31, and 41 and reference voltage line 27 of second portion 55. Reference voltage line 27 is disposed between power supply lines 41 and 28, and overlies conductive layer 23. Capacitive coupling occurs between power supply lines 28 and 41, conductive layer 23, and reference voltage line 27 in second portion 55. Also, conductive layers 23 and 24 are capacitively coupled to P-type region 21 to reduce local transistor switching noise.

For the case in which local, or demand end, $V_{DD}$ and $V_{SS}$ power supply noise are approximately equal in magnitude, capacitive coupling between conductive layers 23 and 24, P-type substrate 21, and N-type region 22 are approximately equal, and are provided to cancel local power supply noise. Specifically, capacitive coupling between conductive layer 24 and N-type region 22, cancels with capacitive coupling between conductive layer 24 and P-type substrate 21. Also, capacitive coupling between conductive layer 23 and N-type region 22, cancels with capacitive coupling between conductive layer 23 and P-type region 21.

FIG. 4 illustrates a cross-sectional view along line 4—4 of FIG. 1, of power supply lines 32 and 36 in the first metal layer and reference voltage line 27 in cross-over area 50. Contact 35 is illustrated coupling power supply line 32 to conductive layer 24, and contact 39 is illustrated coupling power supply line 36 to conductive layer 23. Contacts 35 and 39 are conventional contacts for connecting a polysilicon layer to a metal line, such as a tungsten plug.

Figure 5:
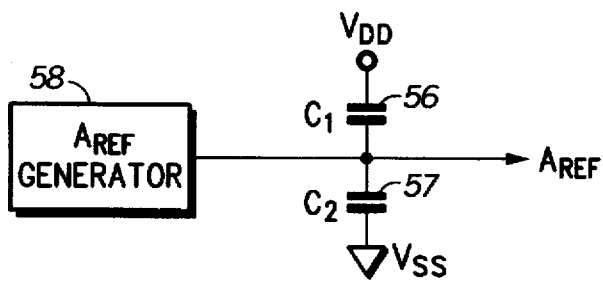
FIG. 5 illustrates in partial block diagram form and partial schematic diagram form, capacitive coupling between the reference line and the power supply lines as a result of the layout of the present invention.

FIG. 5 illustrates in partial block diagram form and partial schematic diagram form, a capacitive coupling between reference voltage line 27 and the power supply lines as a result of layout portion 20 of the present invention. Capacitor 56 is connected between reference voltage $A_{REF}$ and power supply voltage $V_{DD}$ and represents the capacitive coupling between power supply lines 26 and 30 and reference voltage line 27 of first portion 25. Capacitor 57 is connected between reference voltage $A_{REF}$ and power supply voltage $V_{SS}$ and represents the capacitive coupling between power supply lines 28 and 41 and reference voltage line 27 of second portion 55. Reference voltage $A_{REF}$ is provided by $A_{REF}$ generator circuit 58. Capacitance $C_1$ represents the value of the capacitive coupling that occurs in first portion 25. Capacitance $C_2$ represents the value of the capacitive coupling that occurs in second portion 55. The amount of capacitive coupling can be adjusted by adjusting the first and second predetermined lengths, and/or by adjusting the width of metal power supply lines 26, 30, 29, 28, 31, and 41 and reference voltage line 27.

The actual values needed for capacitance $C_1$ and capacitance $C_2$ is determined by factors such as the total number of power supply pins, the number of $V_{DD}$ lines relative to the number of $V_{SS}$ lines, the physical dimensions of the metal lines, and the inductance of the leads coupling an external power supply voltage to power supply voltage pads on the integrated circuit. The affect of coupling capacitances $C_1$ and $C_2$ to reference voltage line 27 is to cause reference voltage $A_{REF}$ to be more stable with respect to the power supply voltage under changing current conditions. P-type regions 21 and N-type regions 22 underlie conductive layers 23 and 24 to reduce local transistor switching noise.

While the invention has been described in the context of a preferred embodiment, it will be apparent to those skilled in the art that the present invention may be modified in numerous ways and may assume many embodiments other than that specifically set out and described above. For example, the power supply lines may be constructed of another conductive material such as polysilicon, instead of a metal. Accordingly, it is intended by the appended claims to cover all modifications of the invention which fall within the true spirit and scope of the invention.

What is claimed is:

1. A layout for reducing power supply noise on a reference voltage, comprising:

a semiconductive substrate;

a first conductive layer overlying the semiconductive substrate;

a second conductive layer overlying the semiconductive substrate and laterally adjacent to the first conductive layer;

a first power supply line overlying the first conductive layer and coupled to the first conductive layer;

a second power supply line overlying the second conductive layer and coupled to the second conductive layer;

a reference voltage line overlying the first conductive layer and laterally adjacent to the first power supply line for a first predetermined length, and for a second predetermined length, the reference voltage line disposed above the second conductive layer and is laterally adjacent to the second power supply line: and well regions implanted in the semiconductive substrate, the well regions underlying predetermined alternating portions of both the first and second conductive layers, wherein a capacitive coupling between the first and second conductive layers and the well regions substantially cancels a capacitive coupling between the semiconductive substrate and the first and second conductive layers.

2. The layout of claim 1, wherein the first power supply line is coupled to a ground potential and the second power supply line receives a power supply voltage.

3. The layout of claim 1, wherein the first conductive layer and the second conductive layer are formed of silicided polysilicon.

4. The layout of claim 1, further comprising:

a third power supply line overlying the first conductive layer and laterally adjacent to the reference voltage line on an opposite side of the first power supply line for the first predetermined length; and a fourth power supply line overlying the second conductive layer and laterally adjacent to the reference voltage line on an opposite side of the second power supply line for the second predetermined length.

5. The layout of claim 1, wherein the reference voltage line and the first and second power supply lines are formed in a first metal layer for the first and second predetermined lengths, the first and second power supply lines formed in a second metal layer for a third predetermined length for crossing the reference voltage line.

6. A layout for reducing power supply noise on a reference voltage, comprising:

a semiconductive substrate;

a first conductive layer overlying the semiconductive substrate;

a second conductive layer overlying the semiconductive substrate, the second conductive layer laterally adjacent to, and spaced apart from, the first conductive layer;

a first power supply line overlying the first conductive layer and coupled to the first conductive layer;

a second power supply line overlying the second conductive layer and coupled to the second conductive layer;

a reference voltage line overlying the first conductive layer and disposed laterally adjacent to the first power supply line for a first predetermined length, the reference voltage line disposed above the second conductive layer and laterally adjacent to the second power supply line for a second predetermined length;

a third power supply line, coupled to the first power supply line, the third power supply line overlying the first conductive layer and laterally adjacent to the reference voltage line on an opposite side of the first power supply line for the first predetermined length;

a fourth power supply line, coupled to the first power supply line, the fourth power supply line overlying the second conductive layer and laterally adjacent to the reference voltage line on an opposite side of the second power supply line for the second predetermined length; and well regions implanted in the semiconductive substrate, the well regions underlying predetermined alternating portions of both of the first and second conductive layers, wherein a capacitive coupling between the first and second conductive layers and the well regions substantially cancels a capacitive coupling between the semiconductive substrate and the first and second conductive layers.

7. The layout of claim 6, wherein the first and third power supply lines are coupled to a ground potential and the second and fourth power supply lines are coupled to a power supply voltage.

8. The layout of claim 6, wherein the first and second conductive layers are formed of silicided polysilicon.

9. The layout of claim 6, wherein the reference voltage line and the first and second power supply lines are formed in a first metal layer for the first and second predetermined lengths, the first and second power supply lines formed in a second metal layer for a third predetermined length for transitioning across the reference voltage line, the third and fourth power supply lines being formed in the first metal layer.

10. The layout of claim 6, wherein the alternating well regions underlie about one-half of a surface area of each of the first and second conductive layers.

11. The layout of claim 6, wherein the first predetermined length is for determining an amount of a first capacitive coupling between the reference voltage line and the first power supply line, and the second predetermined length is for determining an amount of a second capacitive coupled between the reference voltage line and the second power supply line.

* * * * *